(12) United States Patent
Kuang

(10) Patent No.: US 6,853,055 B1
(45) Date of Patent: Feb. 8, 2005

(54) RADIATION SHIELDING DIE CARRIER PACKAGE

(75) Inventor: Raymond Kuang, Fremont, CA (US)

(73) Assignee: Actel Corporation, Mountain View, CA (US)

( * ) Notice: Subject to any disclaimer, the term of this patent is extended or adjusted under 35 U.S.C. 154(b) by 0 days.

(21) Appl. No.: 10/724,531

(22) Filed: Nov. 26, 2003

(51) Int. Cl.[7] .................................. H01L 23/552
(52) U.S. Cl. ........................ 257/659; 438/731
(58) Field of Search ........................ 257/659, 660, 257/704; 438/731

(56) References Cited

U.S. PATENT DOCUMENTS

| | | | |
|---|---|---|---|
| 5,574,314 A | * 11/1996 | Okada et al. | 257/728 |
| 5,635,754 A |   6/1997 | Strobel et al. | 257/659 |
| 5,939,772 A | * 8/1999 | Hurst et al. | 257/659 |
| 6,229,702 B1 | * 5/2001 | Tao et al. | 361/704 |
| 6,625,028 B1 | * 9/2003 | Dove et al. | 361/707 |

* cited by examiner

Primary Examiner—S. V. Clark
(74) Attorney, Agent, or Firm—Sierra Patent Group, Ltd.

(57) ABSTRACT

A semiconductor die carrier includes a radiation shielding base having a radiation shielding integrated base flange extending orthogonally from an upper surface of the base, the integrated base flange having an upper surface. A substrate is disposed on the radiation shielding base and around the integrated base flange, the substrate has an uppermost tier with an upper surface that is not higher than the upper surface of said integrated base flange. A radiation shielding seal lid has a radiation shielding integrated seal lid flange, the radiation shielding integrated seal lid flange has a lower surface disposed on the upper surface of the uppermost tier of the substrate.

35 Claims, 2 Drawing Sheets

RADIATION SHIELDING DIE CARRIER PACKAGE

BACKGROUND OF THE INVENTION

1. Field of the Invention

The present invention relates to a die carrier package. More particularly, the present invention relates to a radiation shielding die carrier package that protects a semiconductor die disposed therein from radiation contacting the die carrier package from any direction.

2. The Background Art

In the extreme environments where semiconductors may be used, it is imperative to shield the semiconductor die from radiation to ensure the reliability of the integrated circuits implemented in the semiconductor die.

Typically, an integrated circuit die is disposed in a plastic or ceramic package that provides little protection for the semiconductor die from radiation. Shielding that is applied to or incorporated into a plastic or ceramic package to protect the semiconductor die from x-ray or other types of electromagnetic radiation is well known to those of ordinary skill in the art. There are problems, however, with the known shielding techniques employed to protect a semiconductor die disposed in a plastic or ceramic package from radiation. These problems include shielding that fails in difficult environments, shielding that does not protect the semiconductor die from every direction, and shielding that is either to cumbersome or expensive to include in the package.

Examples of prior art devices with these problems are disclosed in U.S. Pat. No. 5,635,754, along with descriptions of numerous embodiments of packages designed to provide radiation shielding. Though numerous packages are described which include various amounts of shielding, none of the packages described will prevent radiation from all directions from entering the cavity in the package in which the semiconductor device is disposed. Each of the packages described includes either an insulating feedthrough for external leads or a plastic portion that will allow radiation into the package that is not otherwise blocked by additional shielding.

Programmable logic devices (PLD) are well known to those of ordinary skill in the art. A PLD typically includes uncommitted groups of digital logic, which may be programmed to form higher digital logic functions, and uncommitted routing channels, which may be programmed to connect together the programmed digital logic. An example of a PLD is a field programmable gate array (FPGA). PLDs are often employed in applications where the implementation of an integrated circuit in a semiconductor die using mask programmed techniques is prohibitively expensive because the number of semiconductor dies produced is quite small. Some of the applications PLDs include use in military and aerospace hardware.

BRIEF DESCRIPTION OF THE INVENTION

According to the present invention, a semiconductor die carrier has a radiation shielding base with a radiation shielding integrated base flange having an upper surface extending orthogonally from an upper surface of the base. A substrate is disposed on said radiation shielding base and around said integrated base flange. An uppermost tier of the substrate has an upper surface that is not higher than the upper surface of said integrated base flange. A radiation shielding seal lid has a radiation shielding integrated seal lid flange with a lower surface disposed on the upper surface of the uppermost tier of said substrate. A semiconductor die is disposed in a cavity formed by the radiation shielding base and the radiation shielding integrated base flange, the semiconductor die has an upper surface that is not higher than the upper surface of said integrated base flange.

DETAILED DESCRIPTION OF A PREFERRED EMBODIMENT

Those of ordinary skill in the art will realize that the following description of the present invention is illustrative only and not in any way limiting. Other embodiments of the invention will readily suggest themselves to such skilled persons.

According to the present invention, a semiconductor die is disposed in a package that shields the semiconductor die from radiation particles in all directions. The shielding is provided in the package by a metal shielding material employed to form a base for the package and a seal lid for the package. Both the base and the seal lid each have an integrated flange made from the same metal shielding material as the base and the seal lid. In the assembled package, the flange of the base and the flange of the seal lid are positioned so that surfaces at the end of the flanges are either at the same level or overlap one another slightly.

In this arrangement, the base protects the semiconductor die from radiation below, the seal lid protects the semiconductor die from radiation above and the flanges protect the semiconductor die from radiation on the sides. It will be appreciated by those of ordinary skill in the art that referring to the direction of radiation as being from above, below, and the sides with reference to the semiconductor package is only done to help the reader by providing a frame of reference. It should be well understood that these are merely relative terms such that above, below, and the sides are simply referencing first, second, third or fourth directions.

Figure 1A:
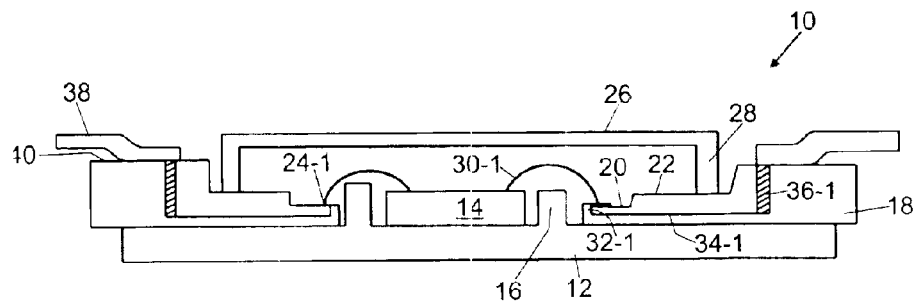
FIG. 1A is a first cross section of a radiation shielding die carrier package according to the present invention.

In FIG. 1A, a radiation shielding semiconductor die package 10 is illustrated in cross-section according to the present invention. The semiconductor die package 10 has a shielding metal base 12 upon which a semiconductor die 14 is disposed. The shielding metal base 12 has an integrated base flange 16 that extends orthogonally from the upper surface of the shielding metal base 12. The shielding metal base 12 and the integrated base flange 16 form a cavity for the disposition of the semiconductor die 14. The integrated base flange 16 surrounds the semiconductor die 14, and is according to the present invention, at least as tall as the semiconductor die 14. Preferably, the integrated base flange 16 will have a height that is 0.05 mm greater than the height of the semiconductor die 14.

Disposed on the shielding metal base 12 and around the perimeter of the integrated base flange 16 is a substrate 18 formed from ceramic or other substrate materials well known to those of ordinary skill in the art. The substrate 18 has first and second tiers 20 and 22, respectively, on which electrically conductive tabs 24 are preferably disposed on an upper side of first and second tiers 20 and 22, respectively. A shielding metal seal lid 26 with an integrated seal lid 28 is disposed on the upper side of the second tier 22 of the substrate 18. The first and second tiers 20 and 22, respectively, each have first or vertical sides which face the outer side of the integrated base flange 16 and are oriented in the same direction as the integrated base flange 16, and second or upper sides which face the underside of shielding metal seal lid 26 and are oriented in the same direction as the shielding metal seal lid 26.

It should be appreciated according to the present invention that tiers in addition to first and second tiers 20 and 22, respectively, may be employed upon which are disposed electrically conductive tabs 24. When tiers in addition to first and second tiers 20 and 22, respectively, are employed according to the present invention, the shielding metal seal lid 26 will be disposed on the uppermost additional tier.

A metal wire 30-1 is used to make an electrical connection from the semiconductor die 14 to the electrically conductive tab 24-1 disposed on first tier 20. The electrically conductive tab 24-1 is coupled to an electrically conductive path that traverses the substrate 18 through a first conductive via 32-1, a conductive line 34-1, and a second conductive via 36-1 connected to an external lead 38 disposed on a lateral portion 40 of the upper edge of the die carrier 10.

In FIG. 1A, a metal wire 30-1 is depicted that connects the semiconductor die 14 to an electrically conductive tab 24-1 on the first tier 20. Not shown in FIG. 1A is the connection of a metal wire 30 from the semiconductor die 14 to an electrically conductive tab 24 on the second tier 22. In order to depict such a connection, in FIG. 1B, a cross-section of the semiconductor die package 10 that is offset from the cross-section of the semiconductor die package shown in FIG. 1A is illustrated which depicts the connection of the semiconductor die 14 by a metal wire 30-2 to an electrically conductive tab 24-2 disposed on the second tier 22 of the substrate 18. The electrically conductive tab 24-2 is coupled to an electrically conductive path that traverses the substrate 18 through a first conductive via 32-2, a conductive line 34-2, and a second conductive via 36-2 connected to an external lead 38 disposed on a lateral portion 40 of the upper edge of the die carrier 10. In an embodiment according to the present invention where additional tiers are employed, the electrically conductive tabs 24 disposed upon the additional tiers may be coupled to external leads 38 in a manner similar to that described for first and second tiers 20 and 22, respectively.

In FIG. 1A, it should be appreciated that the metal wire 30-1, the electrically conductive tab 24-1, the first conductive via 32-1, the conductive line 34-1, the second conductive via 36-1, and external lead 38 represent a plurality of metal wires 30-1, a plurality of electrically conductive tabs 24-1, a plurality of first conductive vias 32-1, a plurality of conductive lines 34-1, a plurality of second conductive vias 36-1, and a plurality of external leads 38. Further, in FIG. 1B, it should be appreciated that the metal wire 30-2, the electrically conductive tab 242, the first conductive via 32-2, the conductive line 34-2, the second conductive via 36-2, and external lead 34 represent a plurality of metal wires 30-2, a plurality of electrically conductive tabs 24-2, a plurality of first conductive vias 32-2, a plurality of conductive lines 34-2, a plurality of second conductive vias 36-2, and a plurality of external leads 38.

Figure 2:
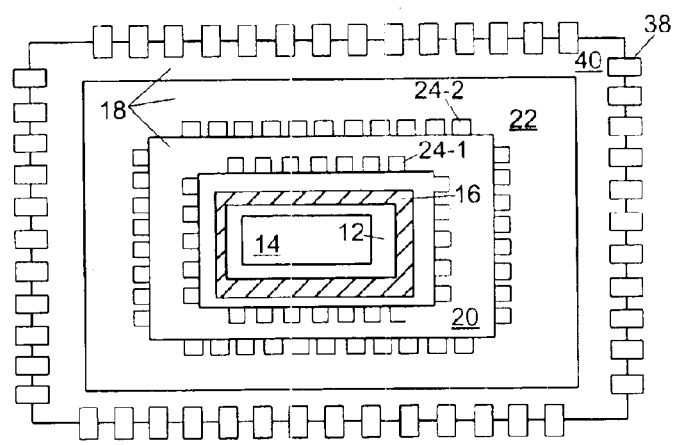
FIG. 2 is a top-down view of a radiation shielding die carrier package according to the present invention.

FIG. 2 illustrates according to the present invention an overhead view of the die carrier 10 without the shielding metal seal lid 26 depicted. In FIG. 2, the shielding metal base 12, the upper surface of the integrated base flange 16, the substrate 18, first and second tiers 20 and 22, respectively, electrically conductive tabs 24-1 and 24-2, and external leads 38 disposed on lateral portions 40 of the upper edge of the die carrier 10 are illustrated.

Figure 1B:
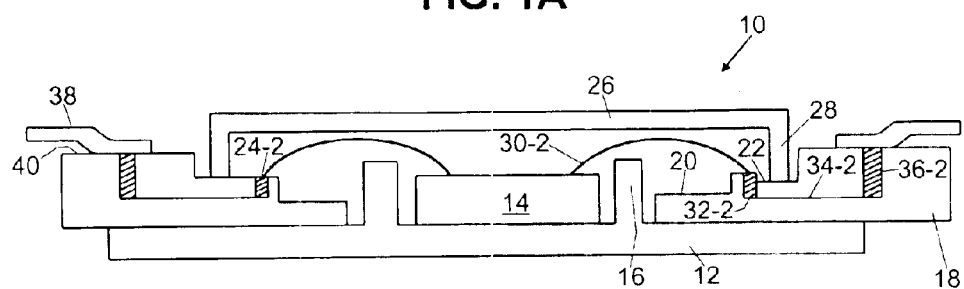
FIG. 1B is a second cross section of a radiation shielding die carrier package according to the present invention.

In FIGS. 1A and 1B, the second tier 22, or the uppermost tier if more than two tiers are employed, is positioned so that the upper surface of the second tier 22 is not higher than the upper surface of the integrated flange 16. Preferably, the height of the second tier 22 is less than the height of upper side of the integrated base flange 16. When the height of the upper surface of the second tier 22 is equal to the height of the upper surface of the integrated base flange 16, the lower surface of the integrated seal lid flange 28 of the shielding metal seal lid 26 will also be positioned so that it is at the same height as the upper surface of the integrated base flange 16. In this manner, the lower surface of the integrated seal lid flange 28 is in the same plane as the upper surface of the integrated base flange 16.

When the height of the upper surface of the second tier 22 is preferably less than the height of the upper surface of the integrated base flange 16, the lower surface of the integrated seal lid flange 28 of the shielding metal seal lid 26 will be positioned lower than the height of the upper surface of the integrated base flange 16. In this manner, the integrated seal lid flange 28 will overlap the integrated base flange 16.

According to the present invention, the disposition of the integrated seal lid flange 28 and the integrated base flange 16 so the lower surface of the integrated seal lid flange 28 is either in the same plane as the upper surface of the integrated base flange 16 or that the integrated seal lid flange 28 overlaps the integrated base flange 16 prevents radiation from reaching the semiconductor die from the side of the die carrier 10.

Figure 3:
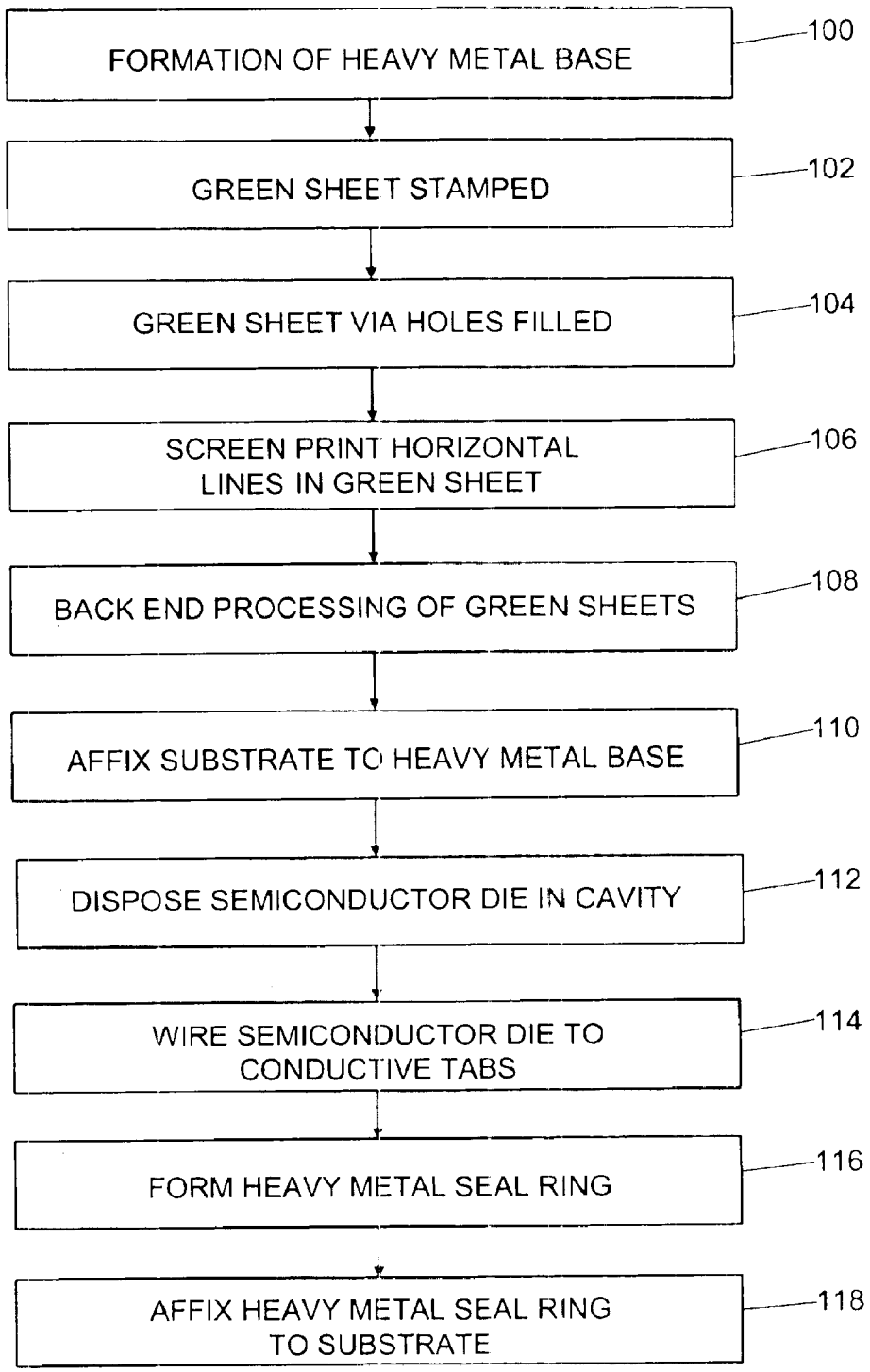
FIG. 3 is a flow diagram describing the process of forming a radiation shielding die carrier package according to the present invention.

In FIG. 3, a flow diagram describing the process of forming a shielding semiconductor die package according to the present invention is described. At step 100, a shielding metal base with an integrated base flange is machined according to any of several known techniques known to those of ordinary skill in the art.

The metal shielding material may be selected for its radiation shielding properties as desired. As is well known in the art, metals with a higher atomic weight, such as tantalum, tungsten or lead typically provide greater radiation shielding than metals with a lower atomic weight such as copper or aluminum. According to the present invention, the shielding material may be either a single atomic element or a combination thereof to provide the level of shielding desired for a particular application. Preferably, the shielding material employed in the base is copper tungsten (CuW), however, it will be appreciated by those of ordinary skill in the art that a variety of radiation shielding materials may be used. Further, it is contemplated according to the present invention that radiation shielding materials that may be developed in the future that may be compatible with the structure of the present invention.

As described above, a substrate is disposed on the shielding metal base. Prior to this disposition, the substrate is first formed by any of several methods of manufacture well known to those of ordinary skill in the art. As an example of such a process of manufacture, a limited description of ceramic die carrier will be made herein. In this process, cut unfired flexible raw ceramic sheets, known to those of ordinary skill in the art as a green sheets, are processed as will be described and then stacked one on top of another and laminated to bond the green sheets together and thereby form the unitary body of the die carrier.

At step 102, a green sheet has a recess for the die carrier and the vias punched out, and at step 104, the via holes are filled with an electrically conductive material, preferably tungsten (W).

At step 106, as the die carrier is being built up from bottom to top, the electrically conductive materials that are disposed horizontally in the die carrier are screen printed as desired on the upper surface of the green sheets. The electrically conductive screen printed material is preferably tungsten (W). The horizontally disposed electrically conductive materials include the electrically conductive tabs disposed on the first and second tiers, the external bond terminals disposed either in recesses on the lateral edges of the die carrier or on the lateral edges of the top of the die carrier and the electrically conductive lines connecting the electrically conductive tabs to the external bond terminals.

At step 108, after the green sheets have been laminated, back end processing steps occur which include shaping, cofiring, nickel plating, metal pad assembly, brazing, finish plating, snap breaking and edge grinding. Each of these steps and others well known to those of ordinary skill in the art will not be described herein to avoid overcomplicating the disclosure and to thereby obscure the present invention.

At step 110, the finished substrate is loaded into an alignment tool, and a silver copper (AgCu) braze material is applied to a portion of the substrate that will be attached to the shielding metal base. The shielding metal base is then also loaded into the alignment tool and affixed to the substrate by brazing in a cofire furnace. The shielding metal base is then nickel and gold plated.

At step 112, the semiconductor die is the disposed within the cavity on the shielding metal base formed by the integrated base flange.

At step 114, the semiconductor die is wired to the conductive tabs by any of several methods well known to those of ordinary skill in the art.

At step 116, the shielding metal seal lid with an integrated seal lid flange is machined according to any of several known techniques known to those of ordinary skill in the art. After machining the shielding metal seal lid is nickel and gold plated, and a layer of AuSn is applied to the lower surface of the integrated seal lid flange.

The metal shielding material may be selected for its radiation shielding properties as desired. As is well known in the art, metals with a higher atomic weight, such as tantalum, tungsten or lead typically provide greater radiation shielding than metals with a lower atomic weight such as copper or aluminum. According to the present invention, the shielding material may be either a single atomic element or a combination thereof to provide the level of shielding desired for a particular application. Preferably, the radiation shielding material employed in the shielding metal seal lid is CuW, however, it will be appreciated by those of ordinary skill in the art that a variety of radiation shielding materials may be used. Further, it is contemplated according to the present invention that radiation shielding materials that may be developed in the future that may be compatible with the structure of the present invention.

At step 118, the shielding metal seal lid is disposed on the substrate, and put into a furnace with a nitrogen gas ambient to affix the shielding metal seal lid to the substrate. The adhesion of the shielding metal seal lid to the substrate is due to the layer of AuSn applied to the lower surface of the seal lid flange.

While the invention has been described with reference to an exemplary embodiment, it will be understood by those skilled in the art that various changes may be made and equivalents may be substituted for elements thereof without departing from the scope of the invention. In addition, many modifications may be made to adapt a particular situation or material to the teachings without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A semiconductor die carrier comprising:
   a radiation shielding base having a radiation shielding integrated base flange extending orthogonally from an upper surface of said base, said integrated base flange having an upper surface;
   a substrate disposed on said radiation shielding base and around said integrated base flange, said substrate having an uppermost tier having an upper surface that is not higher than said upper surface of said integrated base flange; and
   a radiation shielding seal lid having a radiation shielding integrated seal lid flange, said radiation shielding integrated seal lid flange having a lower surface disposed on said upper surface of said uppermost tier of said substrate.

2. A semiconductor die carrier as in claim 1 wherein said upper surface of said uppermost tier is lower than said upper surface of said integrated base flange.

3. A semiconductor die carrier as in claim 2 wherein said upper surface of said uppermost tier is lower than said upper surface of said integrated base flange by at least 0.05 millimeter.

4. A semiconductor die carrier as in claim 1 further including:
   a semiconductor die disposed in a cavity formed by said radiation shielding base and said radiation shielding integrated base flange, said semiconductor die having an upper surface that is not higher than said upper surface of said integrated base flange.

5. A semiconductor die carrier as in claim 4 wherein said upper surface of said semiconductor die is lower than said upper surface of said integrated base flange.

6. A semiconductor die carrier as in claim 5 wherein said upper surface of said semiconductor die is lower than said upper surface of said integrated base flange by at least 0.05 millimeter.

7. A semiconductor die carrier as in claim 1 further including:
   a semiconductor die disposed in a cavity formed by said radiation shielding base and said radiation shielding integrated base flange;
   a plurality of conductive tabs disposed on said uppermost tier;
   a plurality of conductive wires connected between said semiconductor die and said plurality of conductive tabs;
   a plurality of conductive paths formed in said substrate and electrically coupled to said plurality of conductive tabs; and
   a plurality of conductive leads disposed on an outer edge of said substrate and electrically coupled to said plurality of conductive paths formed in said substrate.

8. A semiconductor die carrier as in claim 7 wherein each of said plurality of conductive paths has a first electrically conductive via disposed in said substrate, a second electrically conductive via disposed in said substrate, and an electrically conductive line disposed in said substrate electrically coupled between said first electrically conductive via and said second electrically conductive via.

9. A semiconductor die carrier as in claim 1 wherein said substrate has a plurality of tiers, and further including:
- a semiconductor die disposed in a cavity formed by said radiation shielding base and said radiation shielding integrated base flange;
- a plurality of conductive tabs disposed on said plurality of tiers;
- a plurality of conductive wires connected between said semiconductor die and said plurality of conductive tabs;
- a plurality of conductive paths formed in said substrate and electrically coupled to said plurality of conductive tabs; and
- a plurality of conductive leads disposed on an outer edge of said substrate and electrically coupled to said plurality of conductive paths formed in said substrate.

10. A semiconductor die carrier as in claim 9 wherein each of said plurality of conductive paths has a first electrically conductive via disposed in said substrate, a second electrically conductive via disposed in said substrate, and an electrically conductive line disposed in said substrate electrically coupled between said first electrically conductive via and said second electrically conductive via.

11. A semiconductor die carrier as in claim 1 wherein said substrate is formed from ceramic.

12. A semiconductor die carrier as in claim 1 wherein said radiation shielding base and said radiation shielding integrated base flange are formed from copper tungsten (CuW).

13. A semiconductor die carrier as in claim 1 wherein said radiation shielding seal lid and said radiation shielding integrated seal lid flange are formed from copper tungsten (CuW).

14. A semiconductor die carrier comprising:
- a radiation shielding base having a radiation shielding integrated base flange extending orthogonally from an upper surface of said base, said integrated base flange having an upper surface;
- a substrate disposed on said radiation shielding base and around said integrated base flange, said substrate having an uppermost tier having an upper surface; and
- a radiation shielding seal lid having a radiation shielding integrated seal lid flange, said radiation shielding integrated seal lid flange having a lower surface that is not higher than said upper surface of said integrated base flange and is disposed on said upper surface of said uppermost tier of said substrate.

15. A semiconductor die carrier as in claim 14 wherein said lower surface of said radiation shielding integrated seal lid flange is lower than said upper surface of said integrated base flange.

16. A semiconductor die carrier as in claim 15 wherein said lower surface of said radiation shielding integrated seal lid flange is lower than said upper surface of said integrated base flange by at least 0.05 millimeter.

17. A semiconductor die carrier as in claim 14 further including:
- a semiconductor die disposed in a cavity formed by said radiation shielding base and said radiation shielding integrated base flange, said semiconductor die having an upper surface that is not higher than said upper surface of said integrated base flange.

18. A semiconductor die carrier as in claim 17 wherein said upper surface of said semiconductor die is lower than said upper surface of said integrated base flange.

19. A semiconductor die carrier as in claim 18 wherein said upper surface of said semiconductor die is lower than said upper surface of said integrated base flange by at least 0.05 millimeter.

20. A semiconductor die carrier as in claim 14 further including:
- a semiconductor die disposed in a cavity formed by said radiation shielding base and said radiation shielding integrated base flange;
- a plurality of conductive tabs disposed on said uppermost tier;
- a plurality of conductive wires connected between said semiconductor die and said plurality of conductive tabs;
- a plurality of conductive paths formed in said substrate and electrically coupled to said plurality of conductive tabs; and
- a plurality of conductive leads disposed on an outer edge of said substrate and electrically coupled to said plurality of conductive paths formed in said substrate.

21. A semiconductor die carrier as in claim 20 wherein each of said plurality of conductive paths has a first electrically conductive via disposed in said substrate, a second electrically conductive via disposed in said substrate, and an electrically conductive line disposed in said substrate electrically coupled between said first electrically conductive via and said second electrically conductive via.

22. A semiconductor die carrier as in claim 14 wherein said substrate has a plurality of tiers, and further including:
- a semiconductor die disposed in a cavity formed by said radiation shielding base and said radiation shielding integrated base flange;
- a plurality of conductive tabs disposed on said plurality of tiers;
- a plurality of conductive wires connected between said semiconductor die and said plurality of conductive tabs;
- a plurality of conductive paths formed in said substrate and electrically coupled to said plurality of conductive tabs; and
- a plurality of conductive leads disposed on an outer edge of said substrate and electrically coupled to said plurality of conductive paths formed in said substrate.

23. A semiconductor die carrier as in claim 22 wherein each of said plurality of conductive paths has a first electrically conductive via disposed in said substrate, a second electrically conductive via disposed in said substrate, and an electrically conductive line disposed in said substrate electrically coupled between said first electrically conductive via and said second electrically conductive via.

24. A semiconductor die carrier as in claim 14 wherein said substrate is formed from ceramic.

25. A semiconductor die carrier as in claim 14 wherein said radiation shielding base and said radiation shielding integrated base flange are formed from copper tungsten (CuW).

26. A semiconductor die carrier as in claim 14 wherein said radiation shielding seal lid and said radiation shielding integrated seal lid flange are formed from copper tungsten (CuW).

27. A method for forming a semiconductor die carrier including steps of:

machining a shielding metal base with an integrated shielding metal base flange having an upper surface;

forming a ceramic substrate from green sheets that are processed and then laminated;

affixing said ceramic substrate to said shielding metal base and around said shielding metal integrated base flange;

machining a shielding metal seal lid with an shielding metal integrated seal lid flange having a lower surface; and affixing said shielding metal seal lid to said ceramic substrate so that said lower surface of said integrated shielding metal seal lid flange is not higher than said upper surface of said integrated shielding metal base flange.

28. A method as in claim 27, wherein the step of forming a ceramic substrate from green sheets further includes the steps of:

forming a plurality of conductive paths on said green sheets;

forming a plurality of first conductive vias and a plurality of second conductive vias in said green sheets that are electrically coupled to said conductive paths;

disposing a plurality of electrically conductive tabs on tiers formed in said substrate that are adjacent said integrated shielding metal base flange and are electrically coupled to said first plurality of conductive vias; and disposing external bond terminals on an outer edge of said substrate that are electrically coupled to said second plurality of conductive vias.

29. A method as in claim 28, further including the steps of:

disposing a semiconductor die within a cavity formed by said shielding metal base and said integrated shielding metal base flange; and wiring said semiconductor die to said plurality of electrically conductive tabs.

30. A method as in claim 27, further including the step of:

nickel plating said shielding metal base and said integrated shielding metal base flange after said affixing of said ceramic substrate to said shielding metal base and around said shielding metal integrated base flange.

31. A method as in claim 27, further including the step of:

nickel plating said shielding metal seal lid and said integrated metal seal lid flange after said machining step of said shielding metal seal lid and said integrated shielding metal seal lid flange.

32. A method as in claim 27, wherein the step of affixing said ceramic substrate to said shielding metal base and around said integrated shielding metal base flange further includes the steps of:

loading said ceramic substrate into an alignment tool;

applying a braze material to a portion of said ceramic substrate that will be attached to said shielding metal base;

loading said shielding metal base into said alignment tool; and brazing said ceramic substrate and said shielding metal base in a cofire furnace.

33. A method as in claim 32, wherein said brazing material is silver copper (AgCu).

34. A method as in claim 27, wherein the step of affixing said shielding metal seal lid to said ceramic substrate further includes the steps of:

applying a layer of adhesive material to said lower surface of said integrated shielding metal seal lid flange;

disposing said shielding metal seal lid on said ceramic substrate; and placing said shielding metal seal lid and said ceramic substrate in a nitrogen gas furnace.

35. A method as in claim 34, wherein said adhesive material is AuSn.

\* \* \* \* \*